United States Patent

Kwitkowski

[11] 4,241,448
[45] Dec. 23, 1980

[54] HIGH SENSITIVITY DUAL FUNCTION METER CIRCUIT

[75] Inventor: Peter A. Kwitkowski, Elgin, Ill.

[73] Assignee: Motorola, Inc., Schaumburg, Ill.

[21] Appl. No.: 107,985

[22] Filed: Dec. 28, 1979

[51] Int. Cl.³ ............................................. H04B 17/00
[52] U.S. Cl. .................................. 455/115; 455/226; 324/119
[58] Field of Search ................ 455/67, 115, 226, 155; 324/119, 120, 140 R

[56] References Cited

U.S. PATENT DOCUMENTS 3,746,984  7/1973  Cerveny ............................ 324/119
4,128,810 12/1978  Ogita ................................. 455/155

Primary Examiner—Jin F. Ng
Attorney, Agent, or Firm—James A. Scheer; James W. Gillman

[57] ABSTRACT

In a radio receiver or transmitter circuit, a high sensitivity dual function meter circuit for metering the DC and AC operation of a circuit stage is constructed by connecting a detector diode to a point in the source or emitter circuit of the metered stage rather than to ground. High sensitivity is obtained by passing both the DC and AC current through the detector diode so that a smaller AC voltage swing can be detected.

5 Claims, 1 Drawing Figure

HIGH SENSITIVITY DUAL FUNCTION METER CIRCUIT

BACKGROUND OF THE INVENTION

A. Field of the Invention

This invention relates generally to meter circuitry for electronic systems, and more particularly to a meter driving circuit for metering both a DC and AC operation of a radio circuit stage.

B. Description of the Prior Art

In radio circuits it is common in the prior art to build into selected stages a metering circuit for indication of AC signal levels within the selected stage. The output of this circuit is commonly coupled to a test point or a metering socket. This is done to facilitate testing and maintenance procedures which have to be performed on radio equipment.

Typically, in the prior art, this function is accomplished by coupling the AC signal from some point in the selected stage to the cathode of a diode detector. This point is also coupled to a meter test point while the anode of the diode detector is coupled to ground thereby forming a rectifying circuit which permits metering of RF or audio signal levels.

This approach has a distinct disadvantage in that the AC signal to be detected must have a sufficient voltage swing to overcome the threshold potential (barrier potential) of the diode detector before a signal can be detected. This limits the sensitivity of the metering circuit. To minimize this problem, a germanium diode is commonly used since it has a smaller barrier potential than a silicon diode. In addition, it is often desirable to be able to test the DC bias conditions of the stage as well. However, in the prior art, this would require a separate test point and the performance of a separate test.

This invention is made based on consideration of the above problems and is intended to solve both the sensitivity problem and to provide for metering of both AC and DC conditions with one test point.

SUMMARY OF THE INVENTION

An object of this invention is to provide a meter driving circuit for use in a radio which can detect both AC and DC operating conditions of a selected stage.

It is another object of this invention to provide a meter driving circuit with improved sensitivity.

It is still another object of this invention to provide a meter driving circuit for use in a radio which does not require the use of a detector diode with minimum threshold potential.

Other objects, features and advantages of this invention will become apparent in the following description of the preferred embodiment in conjunction with the accompanying drawings.

Briefly, in accordance with the invention, there is provided a dual function high sensitivity meter circuit for driving a meter to indicate both an AC signal component and a DC bias level of a preselected stage of a radio circuit. A detector is utilized having a first electrode coupled to an AC grounded node within the bias network of the selected stage and a second electrode coupled to an output node such that a DC bias component is transmitted through the detector to the output node. In addition, an AC component of the preselected stage is AC coupled to the output node such that the AC component is rectified and superimposed on the DC bias component. An external meter can then be coupled to the output node to indicate a DC bias level. When an AC signal is present in the circuit, the metering circuit will be able to detect a very small signal swing since the DC bias component has already overcome the barrier potential.

DETAILED DESCRIPTION OF THE INVENTION

Figure 1:
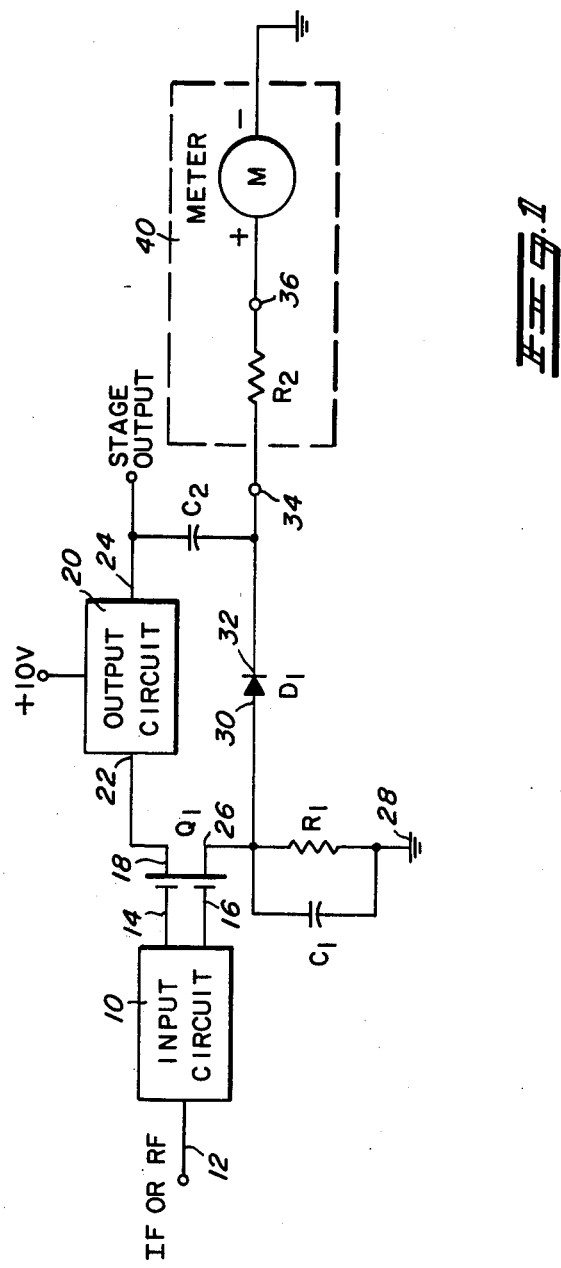
FIG. 1 is a combination block and schematic diagram of a radio FET mixer circuit utilizing the meter driving circuit according to the preferred embodiment of the invention.

FIG. 1 shows the inventive meter driving circuit in conjunction with a dual gate FET mixer circuit. It is to be understood that the invention could be used in conjunction with any stage (FET, bi-polar, etc.) of a radio transmitter or receiver.

An IF or RF signal is applied to the input 12 of input circuitry 10. The input circuitry 10 includes the local oscillator as well as necessary bias circuitry (not shown). A great variety of such circuits are widely known in the radio art and therefore need not be discussed in detail. The bias, the local oscillator signal and the input signal are applied as required to the gates 14 and 16 of a transistor Q1 which is a dual gate FET. The signal generated at the drain 18 of the transistor Q1 is applied to the input 22 of an output circuit 20. The output circuit will couple the desired signal from the drain 18 to its output 24. Such output circuitry is well known in the radio art.

The resistor R1 is coupled from the source 26 of the transistor Q1 to ground 28 and provides DC source bias for the transistor Q1. The capacitor C1 is also coupled from the source 26 to ground 28 and serves as a bypass for R1 thus placing the source 26 of Q1 at AC ground. Also, connected to the source 26 of Q1 is the anode 30 of a diode D1 which has its cathode 32 connected to an output node 34 (D1 is preferably a silicon diode). Also coupled to the output node 34 is an AC signal component from the output circuit 20. This is accomplished via capacitor C2 which is coupled from the output 24 of output circuit 20 to the output node 34.

When the metering circuit is to be used, an external meter indicated generally at 40 is connected to output node 34. Optionally, resistor R2 can be built into the metering circuit in which case the output terminal would be node 36. In either configuration, R2 functions generally as a current limiting resistor.

In order for the metering circuit to function properly, the DC voltage across R1 must be greater than the turn on voltage (i.e., the barrier potential) of diode D1. As a result, current will be able to flow from the source 26 of FET Q1 through diode D1 and current limiting resistor R2 into the meter. This provides an indication of the DC bias condition of FET Q1.

Since capacitor C1 maintains the source 26 of FET Q1 at AC ground, the anode 30 of diode D1 which is also connected to the source 26 of Q1 is also at AC ground. As a result, the AC signal coupled through capacitor C2 from the output stage 20 is rectified by diode D1. The rectified signal adds to the DC from the source 26 of FET Q1.

As a result of the DC bias current flowing in the diode D1, a smaller AC voltage swing can be deteceted than would otherwise be possible without the bias. If D1 is a silicon diode a voltage swing of 0.7 volt is normally required before it will conduct. With a DC bias current flowing through the diode, the 0.7 volt barrier potential is already overcome and greater sensitivity is thereby achieved.

Thus, it is apparent that there has been provided according to the invention, an improved meter driving circuit that satisfies the objectives of the invention. The circuit not only has greater sensitivity, but also dual function capability.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. A dual function high sensitivity meter circuit simultaneously responsive to both an AC signal component of an AC signal being processed by a preselected stage of an associated electronic circuit, and a component of a DC bias voltage from the bias network of the preselected stage, comprising:

(a) means for rectifying an AC signal, having a first electrode and a second electrode;
   (b) means for coupling a DC bias voltage component from the bias network of the preselected stage to the first electrode of the means for rectifying;
   (c) means for AC grounding the first electrode of the rectifying means;
   (d) means for AC coupling a component of an AC signal being processed by the preselected stage to the second electrode of the rectifying means;

whereby the DC bias voltage component is coupled through the rectifying means to the second electrode, and the AC signal component is rectified and superimposed on the DC bias voltage component to comprise a meter driving signal.

2. The dual function high sensitivity meter circuit of claim 1 further comprising:

means for current limiting having one electrode coupled to the second electrode of the rectifying means and a second electrode forming an output terminal.

3. The dual function high sensitivity meter circuit of claim 2 further comprising:

an indicator responsive to the meter driving signal and coupled to the output terminal.

4. The dual function high sensitivity meter circuit of claims 1, 2 or 3 wherein the rectifying means is a silicon diode.

5. The dual function high sensitivity meter circuit of claims 1, 2 or 3 wherein the preselected stage is an FET mixer of a radio.

* * * * *